(12) United States Patent
Sato

(10) Patent No.: US 6,933,578 B2
(45) Date of Patent: Aug. 23, 2005

(54) SEMICONDUCTOR STORAGE DEVICE

(75) Inventor: Tetsumasa Sato, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/865,228

(22) Filed: Jun. 10, 2004

(65) Prior Publication Data

US 2005/0012162 A1 Jan. 20, 2005

(30) Foreign Application Priority Data

Jun. 11, 2003 (JP) ........................ 2003-166635

(51) Int. Cl.$^7$ .................... H01L 29/76; H01L 29/94; H01L 31/062; H01L 31/113; H01L 31/119
(52) U.S. Cl. ............................ 257/393; 257/903
(58) Field of Search ................. 257/393, 903, 257/368

(56) References Cited

U.S. PATENT DOCUMENTS 6,037,638 A    3/2000  Abe et al. ............. 257/393
6,664,603 B2 * 12/2003  Karasawa et al. ...... 257/393
2003/0132490 A1 * 7/2003  Komori .................. 257/393

FOREIGN PATENT DOCUMENTS

JP          10-247691        9/1998

* cited by examiner

*Primary Examiner*—Phat X. Cao
(74) *Attorney, Agent, or Firm*—Harness, Dickey & Pierce, P.L.C.

(57) ABSTRACT

A configuration is provided to reduce the difference in characteristics caused between transistors even in the case where the shapes of gate electrodes vary. To do this, a dummy gate contact region disposed on an isolation region between an n-channel type transistor and a p-channel type transistor is provided in a gate electrode in a manner of corresponding to a gate contact region of another gate electrode.

5 Claims, 3 Drawing Sheets

SEMICONDUCTOR STORAGE DEVICE

RELATED APPLICATIONS

This application claims priority to Japanese Patent Application No. 2003-166635 filed Jun. 11, 2003 which is hereby expressly incorporated by reference herein in its entirety.

BACKGROUND

1. Field of the Invention

The present invention relates to a semiconductor storage device, and particularly relates to a semiconductor storage device suitably applied to a 1.5 port SRAM (Static Random Access Memory).

2. Description of Related Art

In a conventional semiconductor storage device, as disclosed in Japanese Unexamined Patent Application Publication No. 10-247691 for example, there has been a method for constituting an SRAM as below. In the method, four (4) n-channel type transistors and two (2) p-channel type transistors are used. Of these transistors, two (2) n-channel type transistors are used as a driver transistor, the remaining two (2) n-channel type transistors are used as a transfer gate, and the two (2) p-channel type transistors are used as a load transistor, such that an SRAM is constituted.

The driver transistor and load transistor constitute a CMOS inverter where a p-channel type transistor and an n-channel type transistor are coupled to each other in series. A pair of CMOS transistors cross-coupled to each other constitutes a flip-flop.

Meanwhile, there has been a method for constituting a 1.5 port SRAM capable of reading out without depending on a signal of a word line. In the method, one (1) p-channel type transistor is further added to the four (4) n-channel type transistors and two (2) p-channel type transistors, and the added p-channel type transistor is used as a reading-out transistor.

In the 1.5 port SRAM, in order to reduce the area of a memory cell, a gate electrode of one CMOS inverter, which comprises the driver transistor and load transistor, is bent in an L-shape so as to be used as a gate electrode of the reading-out transistor.

However, in the case where a gate electrode of one CMOS inverter comprising the driver transistor and load transistor is used as a gate electrode of a reading-out transistor, the shape of a gate electrode of one CMOS inverter comprising the driver transistor and load transistor is different from the shape of a gate electrode of the other CMOS inverter comprising the driver transistor and load transistor.

Thus, in some cases, a difference in transistor characteristic may be caused between the pair of n-channel type transistors used as a driver transistor, or between the pair of p-channel type transistors used as a load transistor because of a variation in the patterning of the gate electrodes. As a result, the reading and writing operation of the 1.5 port SRAM may be disturbed.

The present invention therefore is intended to provide a semiconductor storage device that can reduce the difference in characteristics caused between transistors even in the case where the shapes of gate electrodes are different from each other.

SUMMARY

In order to solve the above problem, a semiconductor storage device according to one aspect of the present invention comprises: a first driver transistor; a second driver transistor whose drain is coupled to a gate of the first driver transistor and whose gate is coupled to a drain of the first driver transistor; a first load transistor coupled to the first driver transistor in series, a gate of the first load transistor being coupled to the gate of the first driver transistor; a second load transistor coupled to the second driver transistor in series, a gate of the second load transistor being coupled to the gate of the second driver transistor; a first transfer gate whose source is coupled to the drain of the first driver transistor, a drain of the first transfer gate being coupled to a first bit line, and a gate of the first transfer gate being coupled to a word line; a second transfer gate whose source is coupled to the drain of the second driver transistor, a drain of the second transfer gate being coupled to a second bit line, and a gate of the second transfer gate being coupled to the word line; a reading-out transistor coupled to the second load transistor in series, a gate of the reading-out transistor being coupled to the gate of the second load transistor; a first gate contact region disposed between the first driver transistor and the first load transistor, and for establishing contact with the gates of the first driver transistor and the first load transistor; a second gate contact region disposed on a side of the reading-out transistor, and for establishing contact with the gates of the second driver transistor, the second load transistor, and the reading-out transistor; and a dummy gate contact region disposed between the second driver transistor and the second load transistor, and provided corresponding to the first gate contact region.

Thus, even in the case where the disposition location of the first gate contact region provided for the gates of the first driver transistor and the first load transistor is different from that of the second gate contact region provided for the gates of the second driver transistor, the second load transistor, and the reading-out transistor, the shape of the gate electrode between the second driver transistor and the second load transistor can be made to correspond with the shape of the gate electrode between the first driver transistor and the first load transistor.

Accordingly, even in the case where the gate width varies in the vicinity of the contact region provided for the gates of the first driver transistor and the first load transistor, the gate width can be varied in a similar manner in the vicinity of the dummy gate contact region provided for the gates of the second driver transistor, the second load transistor, and the reading-out transistor. Thus, the difference in transistor characteristics caused between the first and second driver transistors, or between the first and second load transistors can be reduced.

A semiconductor storage device according to one aspect of the invention comprises: first and second active regions isolated from each other by an isolation region; a first gate electrode disposed to cross the first active region at two places, and used for a pair of transfer gates; a second gate electrode disposed to cross the first and second active regions, and used for a first driver transistor and a first load transistor; a third gate electrode which is bent so as to cross the first active region and cross the second active region at two places, and used for a second driver transistor, a second load transistor, and a reading-out transistor; a first gate contact region disposed between the first driver transistor and the first load transistor, and for establishing gate-contact with the second gate electrode; a second gate contact region provided on a side of the reading-out transistor, and for establishing gate-contact with the third gate electrode; and a dummy gate contact region disposed between the second driver transistor and the second load transistor, and provided in the third gate electrode in a manner of corresponding to the first gate contact region.

Thus, even in the case where the shape of the second gate electrode used for the first driver transistor and the first load transistor is different from that of the third gate electrode used for the second driver transistor, the second load transistor, and the reading-out transistor, the shape of the third gate electrode between the second driver transistor and the second load transistor can be made to correspond with the shape of the second gate electrode between the first driver transistor and the first load transistor.

Thus, even in the case where the gate width of the second gate electrode varies in the vicinity of the first gate contact region, the gate width of the third gate electrode can be varied in the vicinity of the dummy gate contact region provided in the third gate electrode in a similar manner as the second gate electrode. Accordingly, the difference in transistor characteristics caused between the first and second driver transistors, or between the first and second load transistors can be reduced.

A semiconductor storage device according to one aspect of the invention comprises: a first active region having a U-shaped pattern; a second active region having a T-shaped pattern; an isolation region isolating the first active region from the second active region; a first gate electrode disposed to cross the U-shaped pattern at two places, and used for a pair of transfer gates; a second gate electrode disposed to cross the U-shaped pattern and the T-shaped pattern, and used for a first driver transistor and a first load transistor; a third gate electrode which is bent so as to cross the U-shaped pattern and cross the T-shaped pattern at two places, and used for a second driver transistor, a second load transistor, and a reading-out transistor; a first gate contact region disposed between the first driver transistor and the first load transistor, and for establishing gate-contact with the second gate electrode; a second gate contact region provided on a side of the reading-out transistor, and for establishing gate-contact with the third gate electrode; and a dummy gate contact region disposed between the second driver transistor and the second load transistor, and provided in the third gate electrode in a manner of corresponding to the first gate contact region.

Thus, even in the case where the shape of the second gate electrode used for the first driver transistor and the first load transistor is different from that of the third gate electrode used for the second driver transistor, the second load transistor, and the reading-out transistor since the reading-out transistor is provided, the shape of the third gate electrode between the second driver transistor and the second load transistor can be made to correspond with the shape of the second gate electrode between the first driver transistor and the first load transistor, while the disposition locations of the first gate contact region provided in the second gate electrode and the second gate contact region provided in the third gate electrode can be optimized.

Thus, even in the case where the gate width of the second gate electrode varies in the vicinity of the first gate contact region, the gate width of the third gate electrode can be varied in the vicinity of the dummy gate contact region provided in the third gate electrode in a similar manner as the second gate electrode. Accordingly, the difference in transistor characteristics caused between the first and second driver transistors, or between the first and second load transistors can be reduced while reducing the area of a memory cell.

In the semiconductor storage device according to one aspect of the invention: the U-shaped pattern comprises a first rectangular region, and second and third rectangular regions that are orthogonally coupled to both ends of the first rectangular region; the T-shaped pattern comprises a fourth rectangular region, and a fifth rectangular region that is orthogonally coupled to the center of the fourth rectangular region; the first active region and the second active region are disposed so that the first rectangular region and the fourth rectangular region are opposed to each other; the first gate electrode is disposed to cross the second and third rectangular regions; the second gate electrode is disposed to cross the first rectangular region and the fourth rectangular region; and the third gate electrode which is bent so as to cross the first rectangular region, the fourth rectangular region, and the fifth rectangular region.

According to this, the reading-out transistor can be formed in the second active region, while the third gate electrode used for the second driver transistor and the second load transistor can be used as a gate electrode of the reading-out transistor also. As a result, the reading-out transistor can be added without increasing the area of a memory cell.

The semiconductor storage device according to one aspect of the invention further comprises: a first active contact provided in the second rectangular region marked off by the first gate electrode; a second active contact provided in the third rectangular region marked off by the first gate electrode; a third active contact provided in the first rectangular region between the first gate electrode and the second gate electrode; a fourth active contact provided in the first rectangular region between the first gate electrode and the third gate electrode; a fifth active contact provided in the first rectangular region between the second gate electrode and the third gate electrode; a sixth active contact provided in the fourth rectangular region marked off by the second gate electrode; a seventh active contact provided in the fourth rectangular region marked off by the third gate electrode; an eighth active contact provided in the fifth rectangular region marked off by the third gate electrode; a ninth active contact provided in the fourth rectangular region between the second gate electrode and the third gate electrode; a first wiring layer interconnecting the third active contact, the sixth active contact, and the second gate contact region; a second wiring layer interconnecting the fourth active contact, the seventh active contact, and the first gate contact region; a word line electrically coupled to the first gate electrode; a first bit line coupled to the first active contact; and a second bit line coupled to the second active contact.

According to this, even in the case where the dummy gate contact region is provided in the third gate electrode, the active contacts and the gate contacts can be connected to each other without changing the design such that a 1.5 port SRAM can be constituted without increasing the area of a memory cell.

DETAILED DESCRIPTION

A semiconductor storage device according to the preferred embodiments of the present invention will be described below with reference to accompanying drawings.

Figure 1:
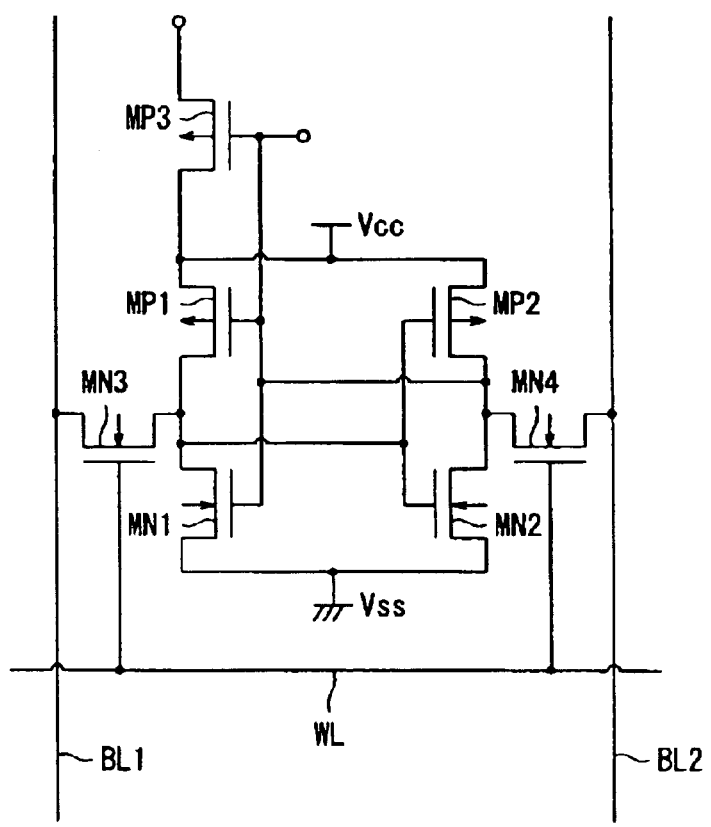
FIG. 1 is a circuit diagram showing a structure of a semiconductor storage device according to a first embodiment.

FIG. 1 is a circuit diagram showing a structure of a semiconductor storage device according to a first embodiment of the invention.

Referring to FIG. 1, an n-channel type transistor MN1 is coupled to a p-channel type transistor MP1 in series, while an n-channel type transistor MN2 is coupled to a p-channel type transistor MP2 in series. A gate of the n-channel type transistor MN1 is coupled to a gate of the p-channel type transistor MP1 and a drain of the n-channel type transistor MN2. A gate of the n-channel type transistor MN2 is coupled to a gate of the p-channel type transistor MP2 and a drain of the n-channel type transistor MN1. Sources of the n-channel type transistors MN1 and MN2 are coupled to Vss terminal. Sources of the p-channel type transistors MP1 and MP2 are coupled to Vcc.

A source of the n-channel type transistor MN3 is coupled to a drain of the n-channel type transistor MN1. A drain of the n-channel type transistor MN3 is coupled to a bit line BL1. A gate of the n-channel type transistor MN3 is coupled to a word line WL. A source of the n-channel type transistor MN4 is coupled to a drain of the n-channel type transistor MN2. A drain of the n-channel type transistor MN4 is coupled to a bit line BL2. A gate of the n-channel type transistor MN4 is coupled to the word line WL.

Meanwhile, a p-channel type transistor MP3 is coupled to the p-channel type transistor MP1 in series. A gate of the p-channel type transistor MP3 is coupled to a gate of the p-channel type transistor MP1.

The n-channel type transistors MN1 and MN2 are used as a driver transistor, the n-channel type transistors MN3 and MN4 are used as a transfer gate and the p-channel type transistors MP1 and MP2 are used as a load transistor, and thereby an SRAM can be constituted. In addition, the p-channel type transistor MP3 is used as a reading-out transistor, and thereby a 1.5 port SRAM can be constituted.

Figure 2:
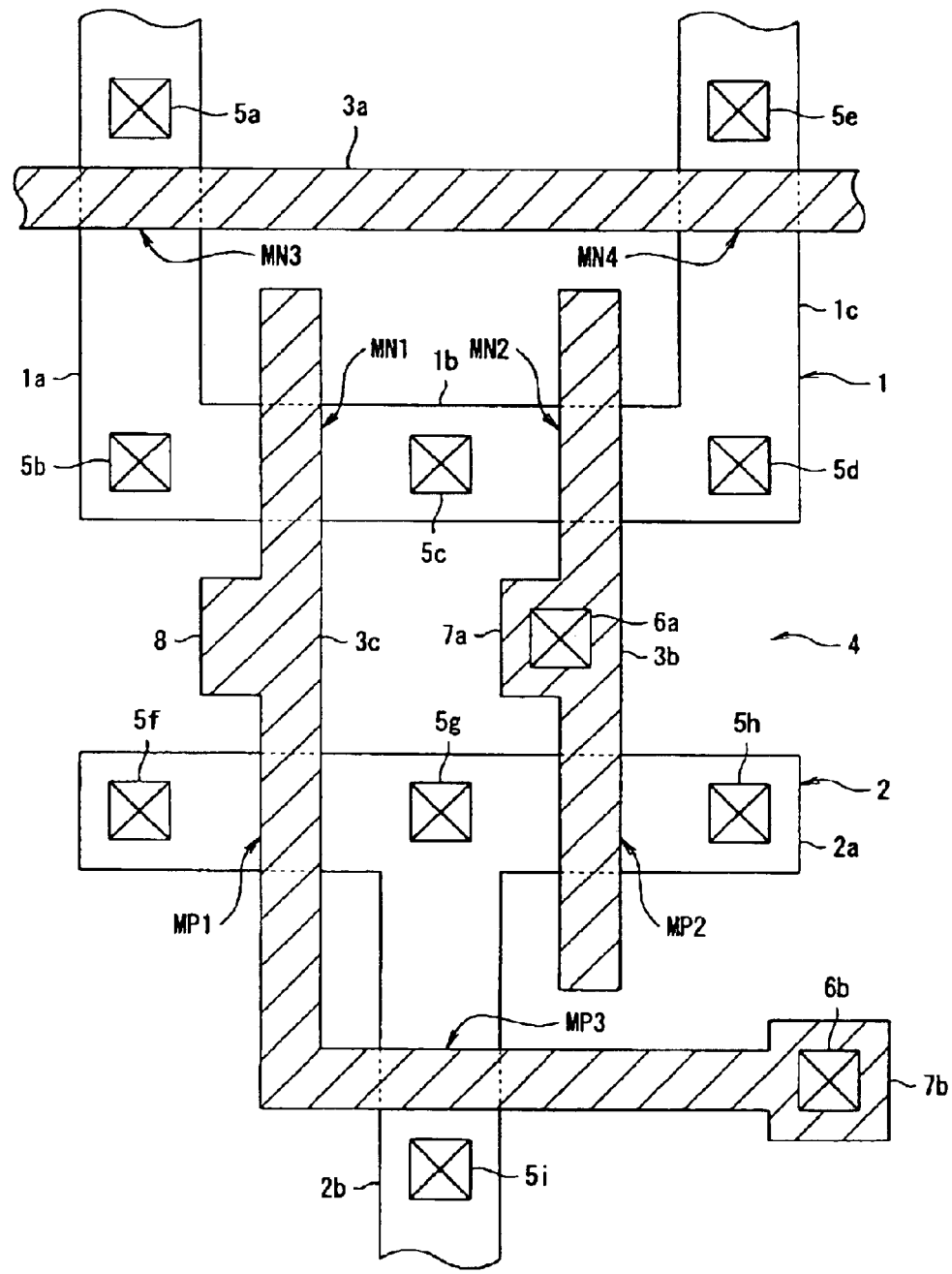
FIG. 2 is a plan view showing a layout of a semiconductor storage device according to a second embodiment.

FIG. 2 is a plan view showing a layout pattern of gate electrodes of a semiconductor storage device according to a second embodiment of the invention.

Referring to FIG. 2, active regions 1 and 2 isolated from each other by an isolation region 4 are provided in a memory cell. The active regions 1 and 2 include a channel region where carrier concentration is controlled in response to voltage applied to gate electrodes 3a through 3c, and source drain regions that are on the both sides of the channel region.

A U-shape pattern is provided in the active region 1. The U-shape pattern includes a rectangular region 1b, and rectangular regions 1a and 1c that are orthogonally coupled to the both ends of the rectangular region 1b. Meanwhile, a T-shape pattern is provided in the active region 2. The T-shape pattern includes a rectangular region 2a, and a rectangular region 2b that is orthogonally coupled to the center of the rectangular region 2a. The active regions 1 and 2 may be disposed so that the rectangular regions 1b and 2a are opposed to each other.

The gate electrode 3a is disposed in a manner of crossing the rectangular regions 1a and 1c. The gate electrode 3b is disposed in a manner of crossing the rectangular regions 1b and 2a. The gate electrode 3c may be bent in an L-shape, and be disposed in a manner of crossing the rectangular regions 1b, 2a and 2b.

The gate electrode 3a disposed on the rectangular region 1a can be used for the n-channel type transistor MN3 of FIG. 1. The gate electrode 3a disposed on the rectangular region 1c can be used for the n-channel type transistor MN4 of FIG. 1. The gate electrode 3b disposed on the rectangular region 1b can be used for the n-channel type transistor MN2 of FIG. 1. The gate electrode 3b disposed on the rectangular region 2a can be used for the p-channel type transistor MP2 of FIG. 1. The gate electrode 3c disposed on the rectangular region 1b can be used for the n-channel type transistor MN1 of FIG. 1. The gate electrode 3c disposed on the rectangular region 2a can be used for the p-channel type transistor MP1 of FIG. 1. The gate electrode 3c disposed on the rectangular region 2b can be used for the p-channel type transistor MP3 of FIG. 1.

An active contact 5a is provided in the rectangular region 1a marked off by the gate electrode 3a, and an active contact 5e is provided in the rectangular region 1c marked off by the gate electrode 3a. An active contact 5b is provided in the rectangular region 1a between the gate electrode 3a and the gate electrode 3c. An active contact 5c is provided in the rectangular region 1a between the gate electrode 3b and the gate electrode 3c. An active contact 5d is provided in the rectangular region 1a between the gate electrode 3a and the gate electrode 3b.

An active contact 5h is provided in the rectangular region 2a marked off by the gate electrode 3b. An active contact 5f is provided in the rectangular region 2a marked off by the gate electrode 3c. An active contact 5i is provided in the rectangular region 2b marked off by the gate electrode 3c. An active contact 5g is provided in the rectangular region 2a between the gate electrode 3b and the gate electrode 3c.

A gate contact region 7a for disposing a gate contact 6a thereon is provided in the gate electrode 3b. The gate contact region 7a may be disposed on the isolation region 4 between the n-channel type transistor MN2 and the p-channel type transistor MP2.

A gate contact region 7b for disposing a gate contact 6b thereon is provided in the gate electrode 3c. The gate contact region 7b may be disposed on the isolation region 4 on a p-channel type transistor MP3 side.

The active contacts 5d and 5h, and the gate contact 6b are connected to each other with Al wiring, and the active contacts 5b and 5f, and the gate contact 6a are connected to each other with Al wiring. Thereby, the pair of CMOS inverters that are made up of the n-channel type transistors MN1 and MN2 and the p-channel type transistors MP1 and MP2 can be cross-coupled to each other.

The active contact 5a is coupled to the bit line BL1 of FIG. 1 with Al wiring therebetween. The active contact 5e is coupled to the bit line BL2 of FIG. 1 with Al wiring therebetween. The active contact 5c is coupled to the Vss terminal of FIG. 1 with Al wiring therebetween. The active contact 5g is coupled to the Vcc terminal of FIG. 1 with Al wiring therebetween.

In the gate electrode 3c, a dummy gate contact region 8 disposed on the isolation region 4 between the n-channel type transistor MN1 and the p-channel type transistor MP1 is provided to correspond to the gate contact region 7a of the gate electrode 3b. The gate electrodes 3a through 3c can be formed by patterning a polysilicon film and so on deposited on the active regions 1 and 2.

Since the dummy gate contact region 8 is provided in the gate electrode 3c, even in the case where the shape of the gate electrode 3b used for the n-channel type transistor MN2 and the p-channel type transistor MP2 is different from the shape of the gate electrode 3c used for the n-channel type transistor MN1 and the p-channel type transistors MP1 and MP3, the shape of the gate electrode 3c between the n-channel type transistor MN1 and the p-channel type transistor MP1 can be made to correspond with the shape of the gate electrode 3b between the n-channel type transistor MN2 and the p-channel type transistor MP2, while the gate contact 6b of the gate electrode 3c can be disposed without obstructing the connection among the active contacts 5b and 5f, and the gate contact 6a.

Thus, even in the case where the gate width of the gate electrode 3b varies in the vicinity of the gate contact region 7a, the gate width of the gate electrode 3c can be varied in the vicinity of the dummy gate contact region 8 provided in the gate electrode 3c in a similar manner as the gate electrode 3b. As a result, the difference in transistor characteristics caused between the n-channel type transistors MN1 and MN2, or between the p-channel type transistors MP1 and MP2 can be reduced while the area of a cell memory is reduced.

Figure 3:
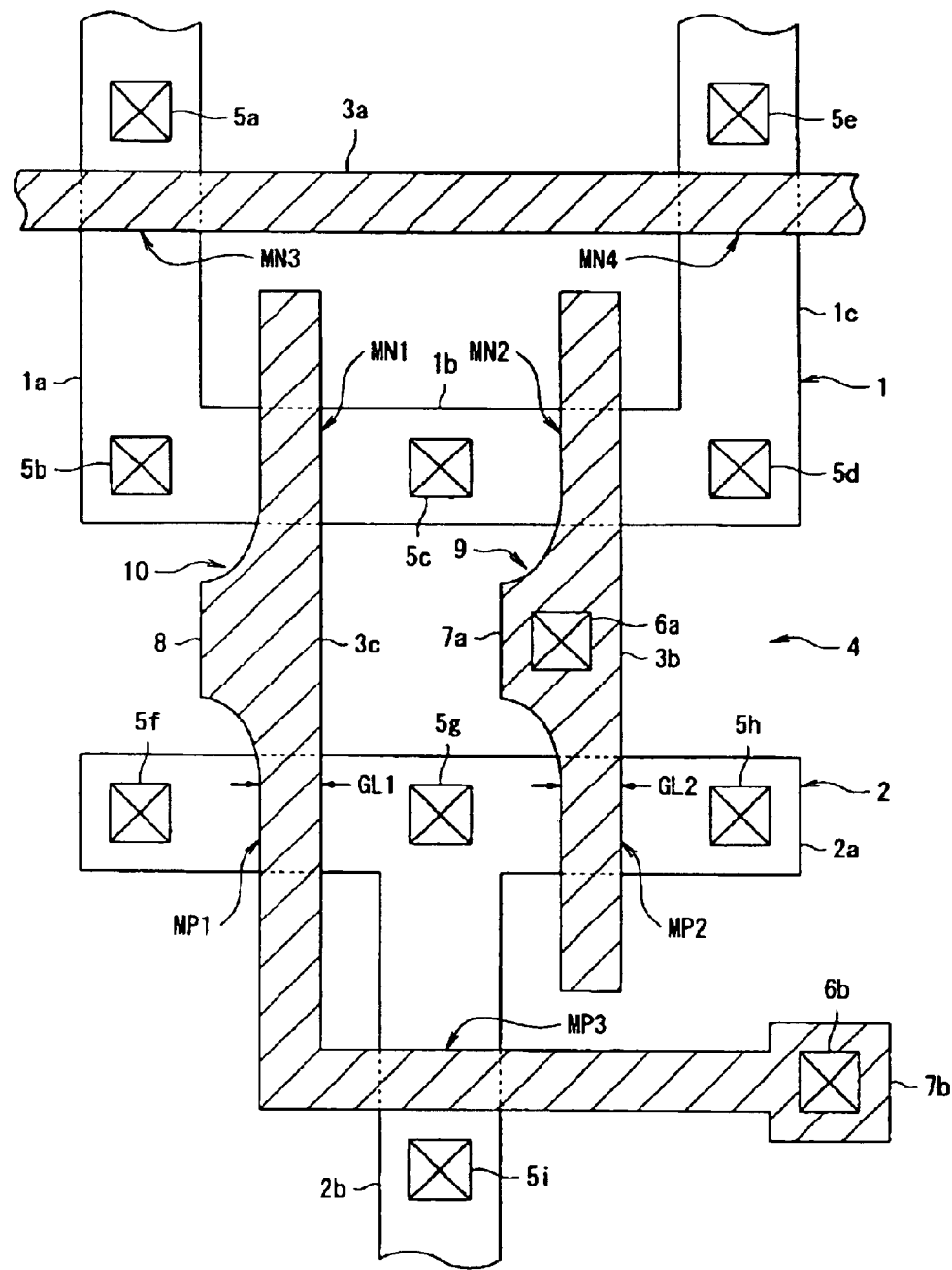
FIG. 3 is a plan view when variation in patterning of gate electrodes is caused.

FIG. 3 is a plan view showing a layout pattern when variation in patterning of gate electrodes of a semiconductor storage device according to one embodiment of the invention is caused.

Referring to FIG. 3, a skirt portion 9 (arcuate) is generated in the gate contact region 7a of the gate electrode 3b since a variation in the etched area of a polysilicon film deposited on the active regions 1 and 2 is caused. In this case, if the interval between the gate contact region 7a and the active region 2 is decreased in order to reduce the area of a cell, the skirt portion 9 of the gate contact region 7a overlaps with the active region 2. If the skirt portion 9 of the gate contact region 7a overlaps with the active region 2, gate width GL2 of the p-channel type transistor MP2 varies such that the transistor characteristic of the p-channel type transistor MP2 varies.

Here, since the gate electrodes 3b and 3c are disposed close to each other, the variation in etching of a polysilicon film of the gate electrode 3b can be equalized to that of the gate electrode 3c. Thus, by providing the dummy gate contact region 8 corresponding to the gate contact region 7a of the gate electrode 3b in the gate electrode 3c, a skirt portion 10 corresponding to the skirt portion 9 of the gate contact region 7a can be generated in the dummy gate contact region 8 also.

As a result, the skirt portion 10 of the dummy gate contact region 8 can be made to overlap with the active region 2, corresponding to the overlapping of the skirt portion 9 of the gate contact region 7a with the active region 2. Accordingly, gate width GL1 of the p-channel type transistor MP1 can be varied corresponding to the variation of the gate width GL2 of the p-channel type transistor MP1 such that the variation of the transistor characteristic of the p-channel type transistors MP1 and MP2 can be equalized to each other.

Furthermore, since the gate electrode 3c is bent in an L-shape, and the gate contact 6b of the gate electrode MP3 is provided on a p-channel type transistor MP3 side, there is no need to provide a gate contact of the gate electrode MP3 in the dummy gate contact region 8. Thus, the active contacts 5b and 5f, and the gate contact 6a can be connected to each other with (e.g., Al) wiring without being obstructed by a gate contact of the gate electrode MP3. Therefore, the active contacts 5b and 5f, and the gate contact 6a can be connected to each other with Al wiring without avoiding the dummy gate contact region 8 such that a 1.5 port SRAM can be constituted without increasing the area of a memory cell.

Although the case of avoiding variation in transistor characteristic between the p-channel type transistors MP1 and MP2 has been described by way of example in the above explanation, in addition thereto, variation in transistor characteristic between the n-channel type transistors MN1 and MN2 can also be avoided.

What is claimed is:

1. A semiconductor storage device, comprising:
a first driver transistor having a gate and a drain;
a second driver transistor including:
    a drain coupled to the gate of the first driver transistor; and
    a gate coupled to the drain of the first driver transistor;
a first load transistor coupled to the first driver transistor in series, a gate of the first load transistor being coupled to the gate of the first driver transistor;
a second load transistor coupled to the second driver transistor in series, a gate of the second load transistor being coupled to the gate of the second driver transistor;
a first transfer gate including:
    a source coupled to the drain of the first driver transistor;
    a drain coupled to a first bit line; and
    a gate coupled to a word line;
a second transfer gate including:
    a source coupled to the drain of the second driver transistor;
    a drain coupled to a second bit line; and
    a gate coupled to the word line;
a reading-out transistor coupled to the second load transistor in series, a gate of the reading-out transistor being coupled to the gate of the second load transistor;
a first gate contact region disposed between the first driver transistor and the first load transistor, and for establishing contact with the gates of the first driver transistor and the first load transistor;
a second gate contact region disposed on a side of the reading-out transistor, and for establishing contact with the gates of the second driver transistor, the second load transistor, and the reading-out transistor; and
a dummy gate contact region disposed between the second driver transistor and the second load transistor, and provided corresponding to the first gate contact region.

2. A semiconductor storage device, comprising:
first and second active regions isolated from each other by an isolation region;
a first gate electrode crossing the first active region at two places, and used for a pair of transfer gates;
a second gate electrode crossing the first and second active regions, and used for a first driver transistor and a first load transistor;
a third gate electrode which is bent so as to cross the first active region and cross the second active region at two places, and used for a second driver transistor, a second load transistor, and a reading-out transistor;
a first gate contact region disposed between the first driver transistor and the first load transistor, and for establishing gate-contact with the second gate electrode;
a second gate contact region provided on a side of the reading-out transistor, and for establishing gate-contact with the third gate electrode; and
a dummy gate contact region disposed between the second driver transistor and the second load transistor, and provided in the third gate electrode in a manner of corresponding to the first gate contact region.

3. A semiconductor storage device, comprising:
a first active region having a U-shaped pattern;
a second active region having a T-shaped pattern;
an isolation region isolating the first active region from the second active region;

a first gate electrode crossing the U-shaped pattern at two places, and used for a pair of transfer gates;

a second gate electrode crossing the U-shaped pattern and the T-shaped pattern, and used for a first driver transistor and a first load transistor;

a third gate electrode which is bent so as to cross the U-shaped pattern and cross the T-shaped pattern at two places, and used for a second driver transistor, a second load transistor, and a reading-out transistor;

a first gate contact region disposed between the first driver transistor and the first load transistor, and for establishing gate-contact with the second gate electrode;

a second gate contact region provided on a side of the reading-out transistor, and for establishing gate-contact with the third gate electrode; and a dummy gate contact region disposed between the second driver transistor and the second load transistor, and provided in the third gate electrode in a manner of corresponding to the first gate contact region.

4. The semiconductor storage device according to claim 3, wherein:

the U-shaped pattern comprises first, second and third rectangular regions, the second and third rectangular regions being orthogonally coupled to both ends of the first rectangular region;

the T-shaped pattern comprises a fourth rectangular region and a fifth rectangular region that is orthogonally coupled to a central region of the fourth rectangular region orthogonally;

the first active region and the second active region are disposed so that the first rectangular region and the fourth rectangular region are opposed to each other;

the first gate electrode crosses the second and third rectangular regions;

the second gate electrode crosses the first rectangular region and the fourth rectangular region; and the third gate electrode is bent so as to cross the first rectangular region, the fourth rectangular region, and the fifth rectangular region.

5. The semiconductor storage device according to claim 4, further comprising:

a first active contact provided in the second rectangular region marked off by the first gate electrode;

a second active contact provided in the third rectangular region marked off by the first gate electrode;

a third active contact provided in the first rectangular region between the first gate electrode and the second gate electrode;

a fourth active contact provided in the first rectangular region between the first gate electrode and the third gate electrode;

a fifth active contact provided in the first rectangular region between the second gate electrode and the third gate electrode;

a sixth active contact provided in the fourth rectangular region marked off by the second gate electrode;

a seventh active contact provided in the fourth rectangular region marked off by the third gate electrode;

an eighth active contact provided in the fifth rectangular region marked off by the third gate electrode;

a ninth active contact provided in the fourth rectangular region between the second gate electrode and the third gate electrode;

a first wiring layer interconnecting the third active contact, the sixth active contact, and the second gate contact region;

a second wiring layer interconnecting the fourth active contact, the seventh active contact, and the first gate contact region;

a word line electrically coupled to the first gate electrode;

a first bit line coupled to the first active contact; and a second bit line coupled to the second active contact.

* * * * *